(12) United States Patent
Potasek et al.

(10) Patent No.: US 9,227,833 B2
(45) Date of Patent: Jan. 5, 2016

(54) VIBRATION ISOLATED MEMS STRUCTURES AND METHODS OF MANUFACTURE

(71) Applicant: Rosemount Aerospace Inc., Burnsville, MN (US)

(72) Inventors: David Patrick Potasek, Lakeville, MN (US); Marcus Allen Childress, Farmington, MN (US)

(73) Assignee: ROSEMOUNT AEROSPACE INC., Burnsville, MN (US)

( * ) Notice: Subject to any disclaimer, the term of this patent is extended or adjusted under 35 U.S.C. 154(b) by 12 days.

(21) Appl. No.: 13/904,578

(22) Filed: May 29, 2013

(65) Prior Publication Data

US 2013/0328140 A1 Dec. 12, 2013

Related U.S. Application Data

(60) Provisional application No. 61/656,398, filed on Jun. 6, 2012.

(51) Int. Cl.
*H01L 41/00* (2013.01)
*B81B 3/00* (2006.01)
*G01C 19/5712* (2012.01)
*G01C 19/5783* (2012.01)

(52) U.S. Cl.
CPC .......... *B81B 3/0018* (2013.01); *G01C 19/5712* (2013.01); *G01C 19/5783* (2013.01)

(58) Field of Classification Search
CPC .... B81B 3/0018; B81B 3/00; G01C 19/5783; G01C 19/5712; H01L 41/00
USPC ........................................................ 257/415
See application file for complete search history.

(56) References Cited

U.S. PATENT DOCUMENTS

| 6,199,429 | B1 * | 3/2001 | Hirosawa | 73/504.15 |
| 2009/0282915 | A1 * | 11/2009 | Ohta et al. | 73/504.12 |
| 2012/0096943 | A1 | 4/2012 | Potasek et al. | |

* cited by examiner

*Primary Examiner* — Selim Ahmed
(74) *Attorney, Agent, or Firm* — Locke Lord LLP; Scott D. Wofsy; Daniel J. Fiorello

(57) ABSTRACT

A microstructure device has a microstructure (e.g., a circuit card assembly, a printed circuit board, etc.) defining a sensitive axis and one or more isolators configured and adapted to be compliant along the sensitive axis and to be rigid along one or more other axes.

11 Claims, 5 Drawing Sheets

VIBRATION ISOLATED MEMS STRUCTURES AND METHODS OF MANUFACTURE

CROSS-REFERENCE TO RELATED APPLICATIONS

This application claims priority to U.S. Provisional Patent Application No. 61/656,398 filed Jun. 6, 2012 which is incorporated by reference herein in its entirety.

BACKGROUND OF THE INVENTION

1. Field of the Invention

The present invention relates to micro-electromechanical systems (MEMS) gyros, and more particularly to systems and methods that isolate vibration induced movements therein.

2. Description of Related Art

Micro-electromechanical systems (MEMS) integrate electrical and mechanical components on the same substrate using micro-fabrication technologies. The electrical components are fabricated using integrated circuit processes, while the mechanical components are fabricated using micromachining processes that are compatible with the integrated circuit processes. This combination makes it possible to fabricate an entire system on a chip using standard manufacturing processes. MEMS devices are commonly applied in design and manufacture of sensor devices, where the mechanical portion of the sensor device provides the sensing capability, and the electrical portion of the sensor device processes the information received from the mechanical portion.

One example of a MEMS device is a gyroscope or gyro, which can measure rotation. Specifically, MEMS gyros rely on conservation of momentum of a structure having limited oscillation motion, e.g., vibrating elements, to detect a Coriolis force and determine angular rate of rotation about an input axis. However, these vibrating elements are inherently resonant and are susceptible to additional oscillatory movements occurring outside desired axes of rotation. That is, the vibrating elements within a MEMS gyro can dynamically gain additional oscillatory movements when they resonate and incur common mode oscillations, which can cause undesired and erroneous outputs. For example, MEMS gyros are oriented and mounted to a body, e.g., an aircraft, via a suspension system. When the suspension system converts a vibration into a rotational oscillation about an input axis, a false rotation signal is generated—this is an "out of balance" condition. A loose suspension lets a gyro mass move independently from the frame thereby allowing false rotations. Further still, as the suspension system degrades with time, temperature, or other aging effects, the suspension system can stiffen and no longer isolate the MEMS die causing false rotation signals. Put simply, any vibration at a frequency that excites the output mode resonance creates errors in the output signal. Moreover, although conventional suspension systems have generally been considered satisfactory for applications where vibration isolation is needed in all directions, improved vibration isolation for MEMS devices is desired.

Despite design efforts to date, eliminating additional and undesired vibrations in conventional MEMS devices remains problematic. Accordingly, there is still a need in the art for systems and methods of isolating and attenuating vibration in an axis specific fashion. The present invention provides a solution for these problems.

SUMMARY OF THE INVENTION

The subject invention is directed to a new and useful microstructure device. The microstructure device has a microstructure (e.g., a circuit card assembly, a printed circuit board, etc.) defining a sensitive axis and one or more isolators configured and adapted to be compliant along the sensitive axis and to be rigid along one or more other axes.

In one embodiment of the subject invention, the microstructure can be compliant along the sensitive axis by way of bearings, and/or by way of elastomer sheets. The microstructure can also define an input axis and an output axis. The microstructure can be substantially rigid about the input axis and substantially compliant about the output axis. In addition, the microstructure can define one or more voids that define the one or more isolators. The one or more isolators can be implemented on at least one of a package level, a circuit card level, and a microstructure level. Further, the one or more isolators can be configured and adapted to reduce transmissibility of vibration at odd sub-harmonics of an output resonant frequency. The microstructure can also have an electrical interconnect across the one or more isolators.

In another aspect, the microstructure device can include a circuit card defining one or more voids that can define a flexible gimbal in the circuit card. The microstructure can be an inertial sensor and that inertial sensor can be a gyroscope. Further, the inertial sensor can include an electromechanical MEMS and/or an optical MEMS.

The subject invention also provides a new and useful sensor device. The sensor device includes a microstructure defining at least one sensitive axis and at least one other axis, wherein the microstructure is configured and adapted to connect to a printed circuit board. The microstructure defines at least one void around a rotation sensitive microstructure component, wherein the at least one void is configured and adapted to provide compliance along the at least one other axis and rigidity along the at least one sensitive axis.

In one embodiment of the subject invention, the rotation sensitive microstructure component can be a MEMS gyro.

In certain embodiments, the sensor device includes a suspension frame, at least one bearing operatively connected to the suspension frame, a printed circuit board operatively connected to the suspension frame and the at least one bearing, and a microstructure device operatively connected to the printed circuit board. The suspension frame defines at least one sensitive axis and at least one other axis. The at least one bearing is configured and adapted to allow the printed circuit board to be compliant about the at least one other axis and rigid about the at least one sensitive axis.

In accordance with certain other embodiments the sensor device can include a printed circuit board and a MEMS gyro. The printed circuit board can define at least one sensitive axis and at least one vibrating axis. The MEMS gyro can be operatively connected to the printed circuit board. Further, the printed circuit board can define at least one void around the MEMS gyro, wherein the at least one void can be configured and adapted to provide compliance along the at least one vibrating axis and rigidity along the at least one sensitive axis.

These and other features of the systems and methods of the subject invention will become more readily apparent to those skilled in the art from the following detailed description of the preferred embodiments taken in conjunction with the drawings.

BRIEF DESCRIPTION OF THE DRAWINGS

So that those skilled in the art to which the subject invention appertains will readily understand how to make and use the devices and methods of the subject invention without undue experimentation, preferred embodiments thereof will be described in detail herein below with reference to certain figures, wherein.

DETAILED DESCRIPTION OF THE PREFERRED EMBODIMENTS

Figure 1:
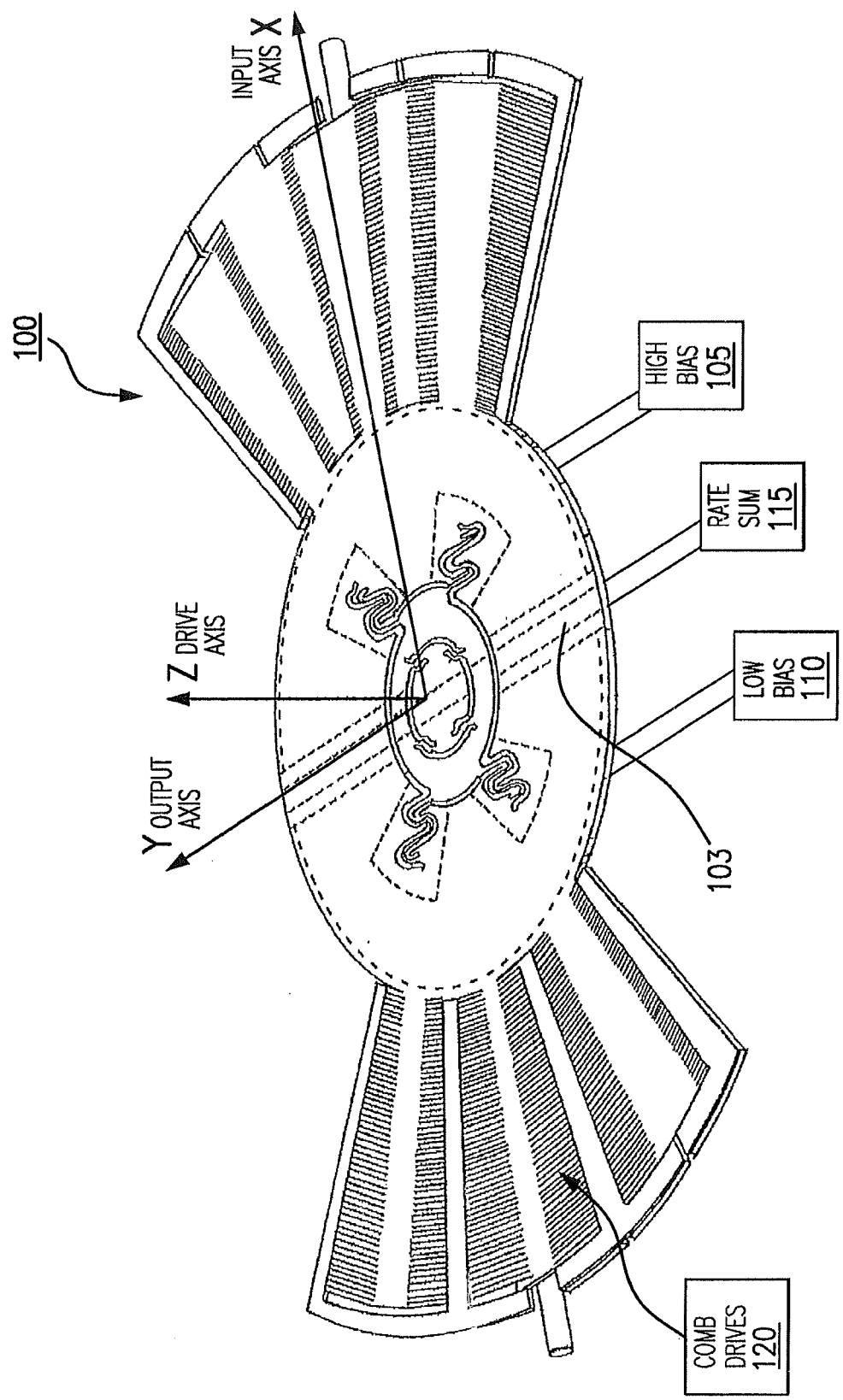
FIG. 1 is a schematic perspective view of an exemplary embodiment of a MEMS gyroscope of a vibratory comb design constructed in accordance with the present invention.

Reference will now be made to the drawings wherein like reference numerals identify similar structural features or aspects of the subject invention. For purposes of explanation and illustration, and not limitation, a schematic cut-away perspective view of an exemplary embodiment of a system that isolates vibration induced movements in accordance with the present invention is shown in FIG. 2A and is designated generally by reference character 200. Other embodiments of the vibration induced movements isolation system in accordance with the invention, or aspects thereof, are provided in FIGS. 1, 2B, 3A, 3B, 3C and 4 as will be described.

As discussed above, MEMS gyros are resonant structures that are inherently susceptible to unwanted vibrations. Vibration isolation for MEMS gyros pose a unique level of difficulty because MEMS gyros sense motions that any unwanted vibrations produce and further dynamically gain that motion when they resonate. For example, traditional suspension systems are compliant about one or more axes; however, such compliance results in the unwanted oscillations. Even traditional spring-mass dampener suspension systems fail to attenuate unwanted oscillations since they cannot be compliant about an output axis and stiff about an input axis due to the resonant modes typically occurring close in all directions (e.g., 30%).

The systems and methods described herein divorce (e.g., split) vibration isolation in the input axis and the output axis, so it affects the input and output modes differently. Accordingly, the microstructure devices, systems and methods disclosed herein drastically attenuate vibrations on the output axis so as to prevent or dampen undesired resonance. In particular, the embodiments of the present invention provide systems and methods that attenuate vibration about one axis, while providing stability along an orthogonal axis. In this manner, these systems and methods provide a microstructure device having a MEMS gyro mounted to a suspension system that attenuates high frequency vibrations caused by the resonant Q of the MEMS vibrating elements, and the low frequency broad range noise caused by false rotation input axis coupling.

As described herein, MEMS gyroscopes typically have three separate, but orthogonally related axes defined as follows: (1) an input axis, (2) an output axis, and (3) a drive or rate axis. MEMS gyros are designed to determine the rate of rotation about the input axis via a Coriolis force present at the output axis. In this manner, the MEMS gyro is rotationally oscillated about the input axis and the Coriolis force is generated as follows: ($F_{coriolis}=2m_{microstructure}v_{drive}\times\Omega_{input}$).

Figure 2A:
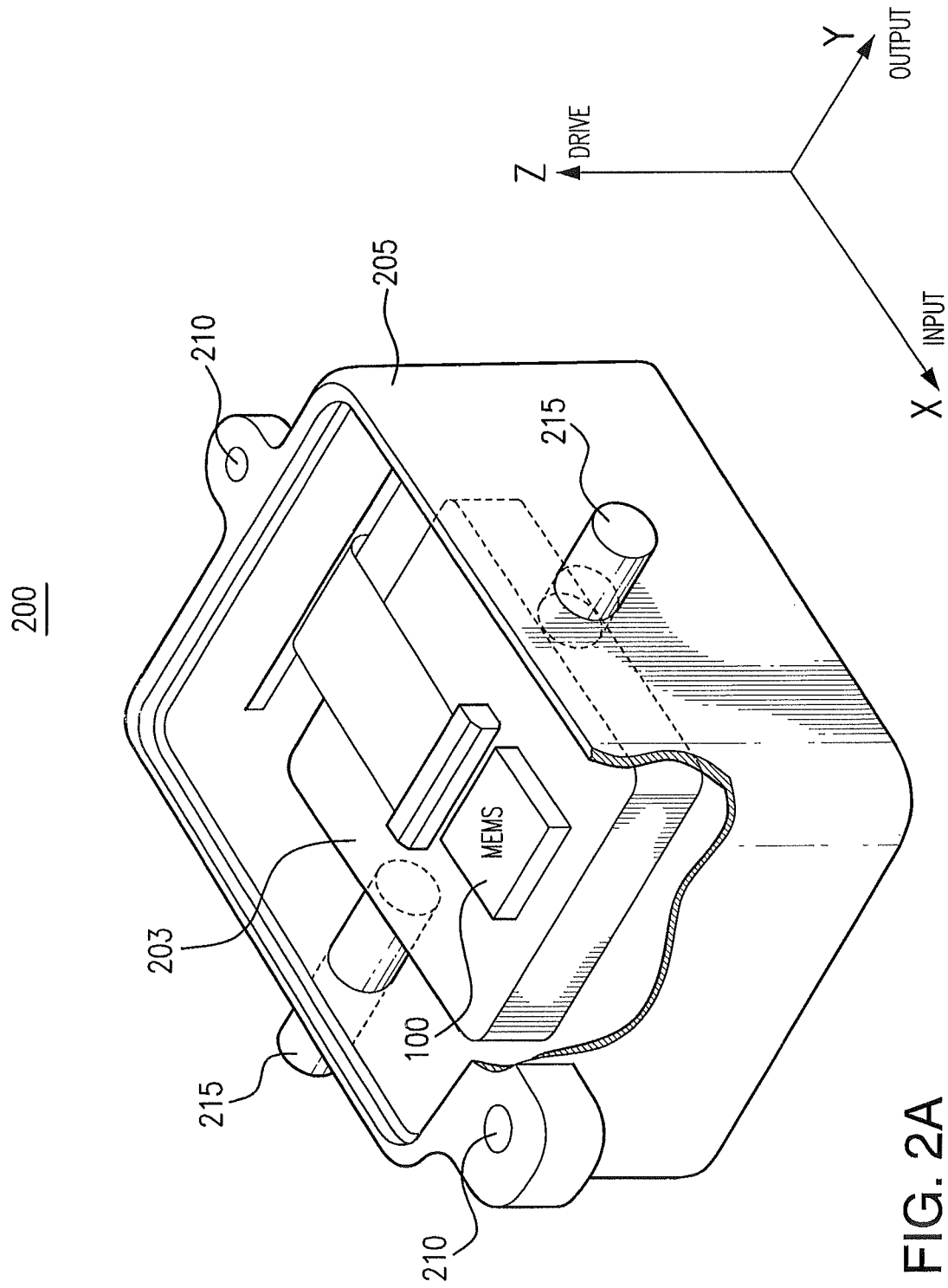
FIG. 2A is a schematic cut-away perspective view of another exemplary embodiment of a full gyroscope sensor assembly having a MEMS gyro mounted to a printed circuit board with vibration isolation techniques in accordance with the present invention.

Operationally, with particular reference to FIG. 1, a schematic perspective view of one exemplary embodiment of a MEMS gyroscope 100 of a vibratory comb design is illustrated. MEMS gyroscope 100 includes a high voltage bias 105 and low voltage bias 110, which are placed on either side of an output axis Y. As discussed in U.S. Patent Application Publication No. 2012/0096943A1, incorporated herein by reference, a disc 103 forms a capacitive plate that balances along the Y axis. A difference in capacitance for MEMS 100 changes when one side of the plate is displaced by a Coriolis force about output axis Y, caused from MEMS gyroscope 100 rotationally vibrating about a drive axis Z, thus rotating MEMS 100 about input axis X (due to the Coriolis force). In turn, this change in capacitance generates a current signal, i.e., rate sum 115. This current signal can be further converted into a voltage (e.g., with a charge amplifier) and provides an indication of the rate of rotation about input axis X. In some embodiments, the MEMS gyro can use a vacuum environment to generate higher Q values. For example, in a vacuum environment dampening is reduced to generate higher Q values. A Q value is a dimensionless dynamic gain factor used to describe resonate systems. MEMS gyro includes vibrating elements (here the vibrating elements are comb-type vibrating elements 120) that oscillate at a predetermined amplitude or rate in the plane formed by input axis X and output axis Y. Rotation of MEMS gyro 100 about drive axis Z causes a corresponding value of rate sum 115 to change according to the rate of rotation around input axis X.

Referring now to FIG. 2A, a cut-away perspective view of one exemplary embodiment of a microstructure device 200 having MEMS gyro 100 mounted to a printed circuit board 203 constructed in accordance with the present invention is shown. In particular, microstructure device 200 includes MEMS gyro 100 disposed within a suspension frame 205. Microstructure device 200 provides split-mode vibration isolation due to compliance about output axis Y, and rigidity in all other directions. In particular, microstructure 200 accomplishes the split mode isolation by providing bearings 215 to allow printed circuit board 203 (which MEMS 100 is mounted to) to be compliant about output axis Y via bearings 215, while also providing rigid connection points 210 to affix microstructure 200 to the aircraft body. Bearings 215 essentially provide a compliant spring that can attenuate or isolate all rotational motion about output axis Y to significantly reduce false input rotation.

Figure 2B:
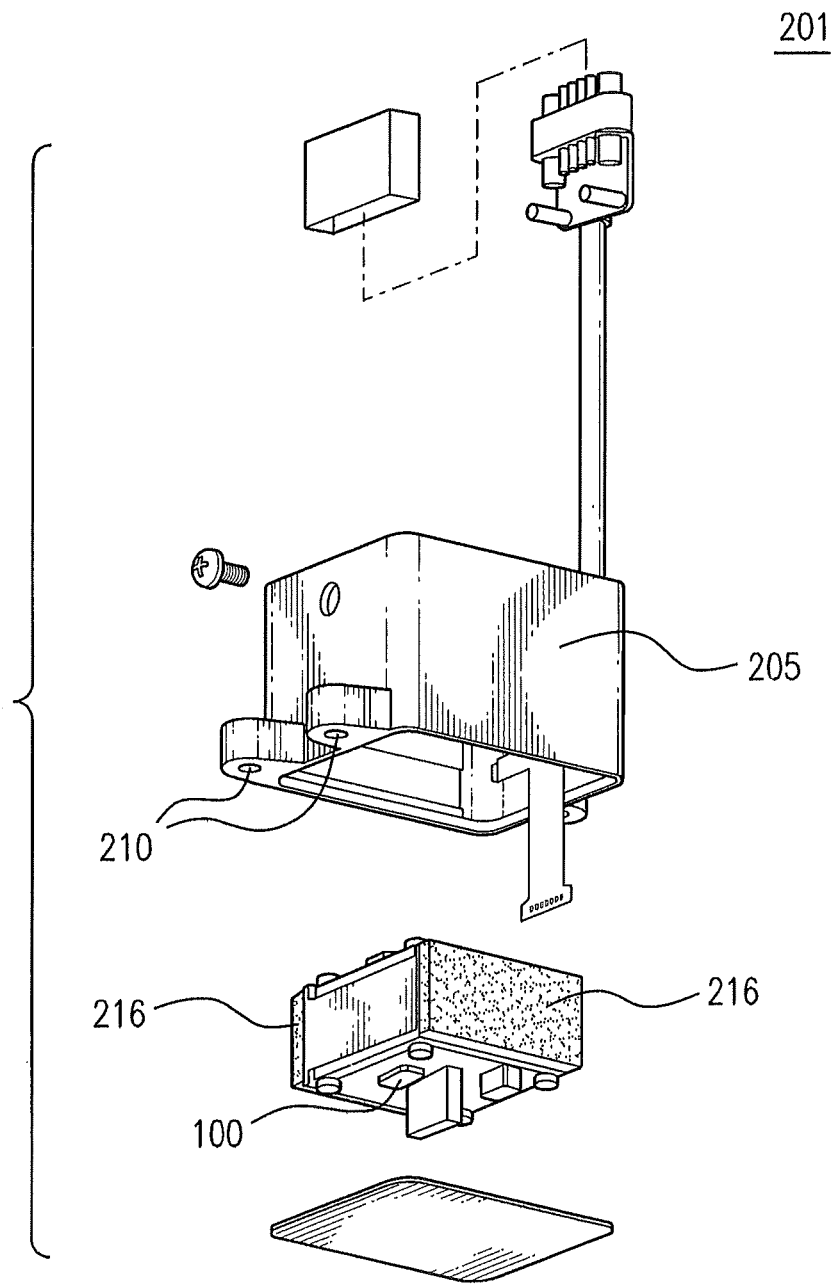
FIG. 2B is a schematic exploded view of the gyroscope sensor assembly of FIG. 2A, showing silicon elastomer sheets.

Referring now to FIG. 2B, a perspective view of another exemplary embodiment of a microstructure device assembly 201 is shown. FIG. 2B is similar to FIG. 2A, however, silicone elastomer sheets 216 are included so as to allow output axis motion while restricting input axis X motion. Since elastomer sheets 216 are designed to be more compliant to torsion forces than for compression forces, elastomer sheets 216 are mounted on the gyro mass surface perpendicular to output axis Y. Notably, for the size and shape of elastomer sheets 216 used in FIG. 2 B, elastomer sheets 216 are more compliant in shear versus compression.

Figure 3A:
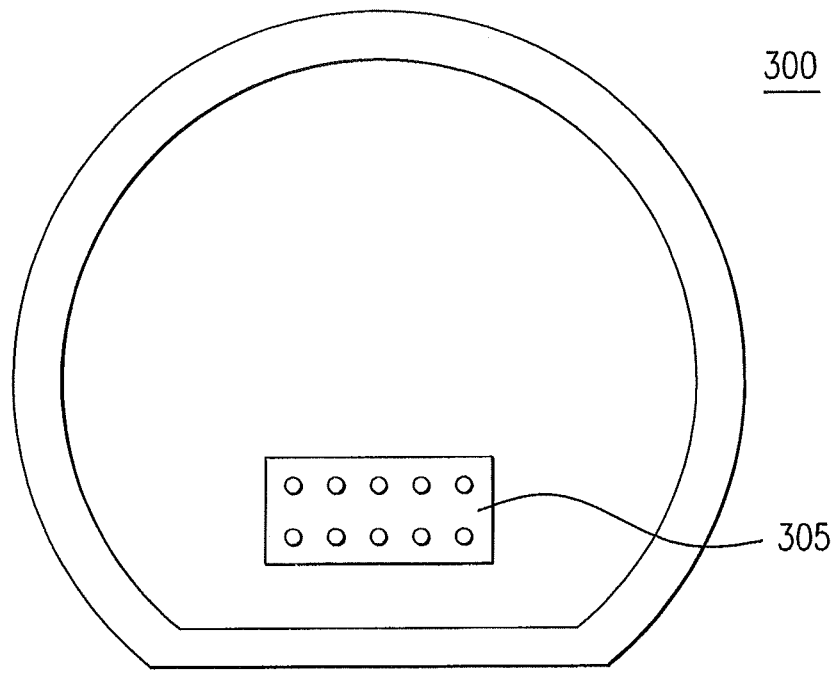
FIG. 3A is an external schematic view of another exemplary embodiment of a microstructure configured and adapted to house a MEMS gyro and provide axis specific vibration isolation in accordance with the present invention.
Figure 3B:
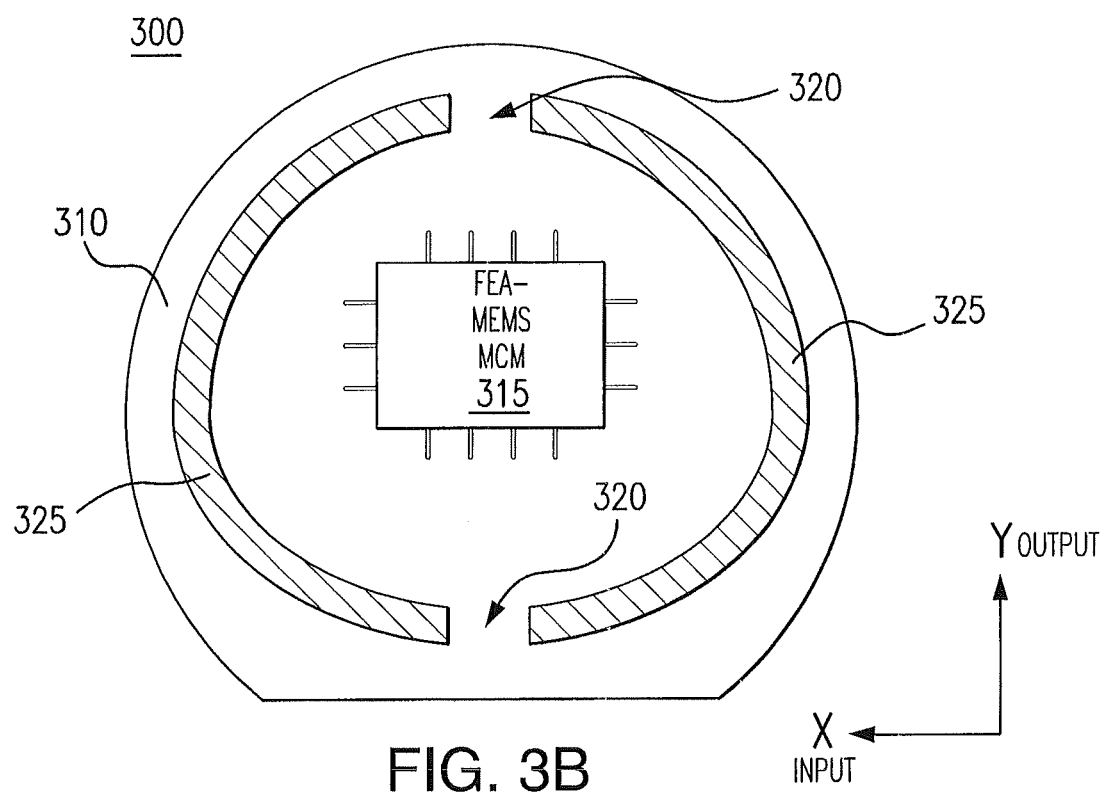
FIG. 3B is an internal view of the microstructure of FIG. 3A showing the MEMS gyro mounted on a circuit card.
Figure 3C:
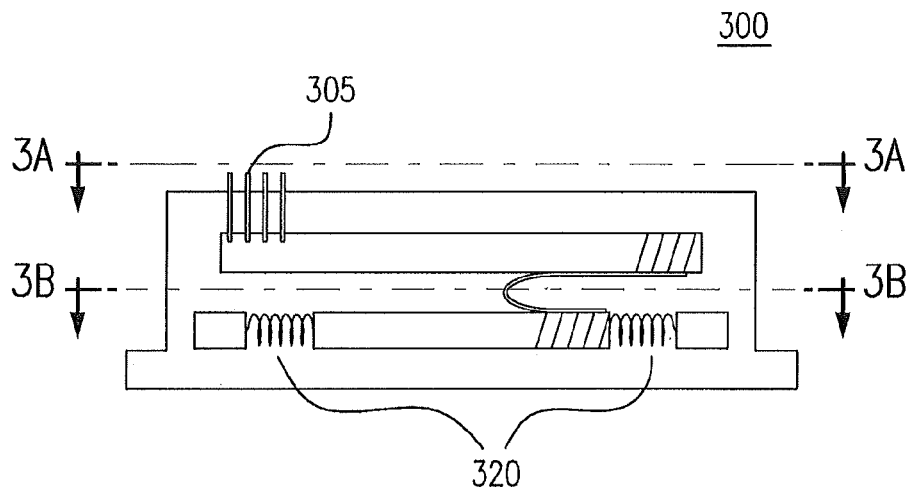
FIG. 3C is a cross-sectional schematic view of the microstructure of FIG. 3A showing symbolically illustrated axis specific springs.

Referring to FIG. 3A-3C, external, internal, and cross-sectional schematic views of another exemplary embodiment of a microstructure 300 configured and adapted to house a MEMS gyro and provide axis specific vibration isolation in accordance with the present invention are shown. In particular, FIG. 3A is an external view of microstructure 300, which includes a connector 305. FIG. 3A corresponds with the external view of microstructure 300 at a position indicated in FIG. 3C.

With reference now to FIG. 3B, an internal view of microstructure 300 at a position, e.g., 3B, as indicated in FIG. 3C, is shown. Microstructure 300 includes a circuit card assembly (CCA) 310 onto which a MEMS gyro, e.g., FEA-MEMS MCM 315, is mounted. In this embodiment, springs 320, e.g. a flexible gimbal, are formed from voids 325 in CCA 310. As illustrated, springs 320 provide vibration isolation about the output axis Y, while maintaining rigidity, e.g., sensitivity, about both the input axis X and the drive axis Z.

With reference now to FIG. 3C, a cross section view of microstructure 300 is shown. As illustrated, microstructure 300 includes axis specific springs 320. Notably, axis specific springs 320 are symbolically illustrated.

Figure 4:
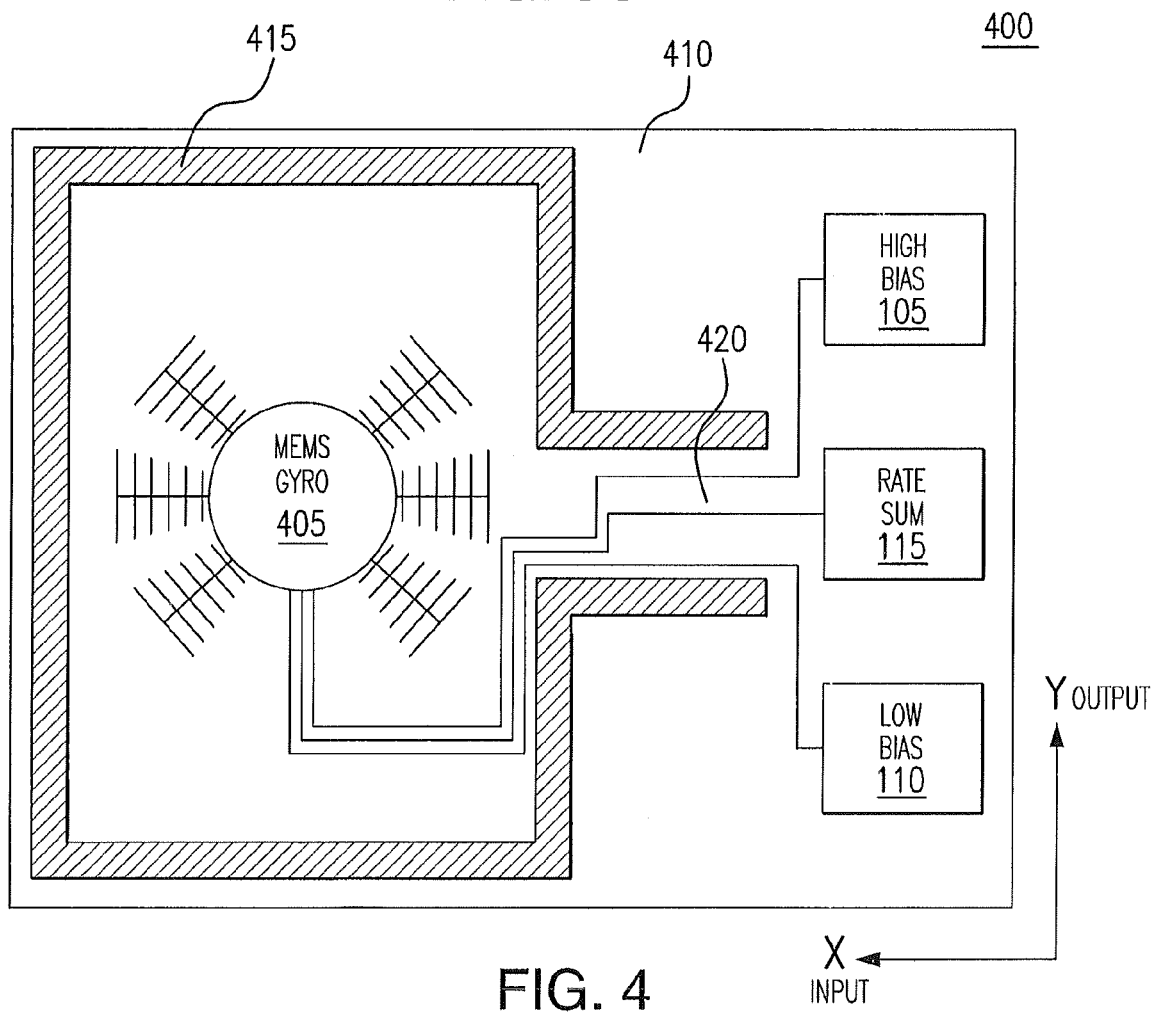
FIG. 4 is a schematic plan view of another exemplary embodiment of a microstructure constructed in accordance with the present invention showing a spring board cut-away in a MEMS die structure that provides axis specific vibration for a MEMS gyro included therein.

Referring to FIG. 4, a plane view of another exemplary embodiment of a microstructure 400 constructed in accordance with the present invention is shown. The plane view of microstructure 400 includes spring board cut-away regions 415, e.g. voids, in a MEMS die assembly rigid frame 410 (e.g., a silicon chip) that provides axis specific vibration for a MEMS gyro 405 mounted thereto. Similar to FIG. 3B, MEMS die regions 415 are absent in order to create an axis specific spring 420. Microstructure 400 isolates vibration around the output axis Y, while maintaining stiffness, e.g., sensitivity, around the input axis X. Notably, microstructure 400 represents a MEMS die level microstructure, which can, for example, be contained within FEA MEMS MCM 315 (FIG. 3) or MEMS 100 (FIG. 1). In operation, rigid frame 410 rotates along the input axis X while spring 420 isolates MEMS gyro 405 from vibrations in rigid frame 410. In this fashion, microstructure 400 provides a MEMS die level, low cost, efficient system that provides rigidity along one axis, while compliance along another axis.

Accordingly, the devices, systems and methods disclosed herein provide microstructures to isolate vibration for MEMS gyros through compliance in one direction, while maintaining rigidity in all other directions.

Those skilled in the art will readily appreciate that any suitable microstructure device having a MEMS gyro can benefit from the system and methods of this invention. Those skilled in the art will readily appreciate that the figures illustrate exemplary configurations with reference to input X, output Y, and drive Z axes, and are not intended to limit the scope of the embodiments of the present invention. In some additional embodiments, the bearings and/or springs can be oriented in any or all of the three axes disclosed herein without departing from the spirit and scope of the invention. Further, those skilled in the art will readily appreciate that multiple microstructure devices can be employed, in conjunction, to determine rotation in all directions of an aircraft body or on any other suitable application.

The methods and systems of the present invention, as described above and shown in the drawings, provide for microstructure devices having superior properties including isolation of vibration along a particular axis, while maintaining rigidity in one or more other directions. While the devices and methods of the subject invention have been shown and described with reference to preferred embodiments, those skilled in the art will readily appreciate that changes and/or modifications may be made thereto without departing from the spirit and scope of the subject invention.

What is claimed is:

1. A sensor device comprising:
   a suspension frame defining at least one sensitive axis and at least one other axis;
   at least one bearing operatively connected to the suspension frame;
   a printed circuit board operatively connected to the suspension frame and the at least one bearing, wherein the at least one bearing is configured and adapted to allow the printed circuit board to be compliant about the at least one other axis and rigid about the at least one sensitive axis; and
   a microstructure device operatively connected to the printed circuit board.

2. The sensor device of claim 1, wherein the microstructure device includes a microstructure that defines a microstructure sensitive axis and includes one or more isolators configured and adapted to be compliant along the microstructure sensitive axis and to be rigid along one or more other axes.

3. The sensor device of claim 2, wherein the microstructure is compliant along the microstructure sensitive axis by way of elastomer sheets.

4. The sensor device of claim 2, wherein the microstructure defines one or more voids that define the one or more isolators.

5. The sensor device of claim 2, wherein the microstructure is an inertial sensor.

6. The sensor device of claim 5, wherein the inertial sensor is a gyroscope.

7. The sensor device of claim 6, wherein the inertial sensor includes at least one of an electromechanical MEMS and an optical MEMS.

8. The sensor device of claim 7, wherein the microstructure further defines an input axis and an output axis, wherein the microstructure is substantially rigid about the input axis and substantially compliant about the output axis.

9. The sensor device of claim 2, wherein the one or more isolators are configured and adapted to reduce transmissibility of vibration at odd sub-harmonics of an output resonant frequency.

10. The sensor device of claim 2, further comprising an electrical interconnect across the one or more isolators.

11. The sensor device of claim 1, wherein the microstructure device defines at least one microstructure device sensitive axis and at least one other axis, wherein the microstructure device defines at least one void around a rotation sensitive microstructure component, wherein the at least one void is configured and adapted to provide compliance along the at least one other axis and rigidity along the at least one microstructure device sensitive axis.

* * * * *